United States Patent [19]

Ishii

[11] Patent Number: 5,645,393

[45] Date of Patent: Jul. 8, 1997

[54] IC STOCKER, IC UNLOADING AND POSITIONING APPARATUS, AND IC FEED SYSTEM

[75] Inventor: Mitoshi Ishii, Ohita, Japan

[73] Assignee: Ishii Tool & Engineering Corporation, Ohita, Japan

[21] Appl. No.: 94,039

[22] PCT Filed: Nov. 30, 1992

[86] PCT No.: PCT/JP92/01571

§ 371 Date: Jul. 29, 1993

§ 102(e) Date: Jul. 29, 1993

[87] PCT Pub. No.: WO93/11061

PCT Pub. Date: Jun. 10, 1993

[30] Foreign Application Priority Data

Dec. 4, 1991 [JP] Japan ................... 3-348180

[51] Int. Cl.$^6$ ................................. B65B 69/00
[52] U.S. Cl. .............. 414/417; 414/900; 414/926; 294/119.1; 269/227; 269/153; 269/43; 269/13
[58] Field of Search ..................... 414/416, 417, 414/351, 900, 926, 749; 211/1.57, 49.1, 175, 184; 294/119.1, 67.33, 81.62; 269/13, 14, 43, 153, 227

[56] References Cited

U.S. PATENT DOCUMENTS

| | | | |
|---|---|---|---|
| 3,410,421 | 11/1968 | Groll | 414/900 |
| 4,938,655 | 7/1990 | Asano | 414/417 X |
| 5,127,695 | 7/1992 | Zoeten | 294/67.33 |

FOREIGN PATENT DOCUMENTS

| | | |
|---|---|---|
| 92924035 | 1/1994 | European Pat. Off. . |
| 60-242140 | 12/1985 | Japan . |
| 62-169424 | 7/1987 | Japan . |
| 62-183629 | 11/1987 | Japan . |
| 64-2942 | 1/1989 | Japan . |
| 1-140731 | 6/1989 | Japan . |
| 1-212449 | 8/1989 | Japan . |
| 2-58842 | 2/1990 | Japan . |
| 3-211145 | 9/1991 | Japan . |
| 3-218642 | 9/1991 | Japan . |
| 3-232628 | 10/1991 | Japan . |
| 3-245539 | 11/1991 | Japan . |
| 4-12912 | 1/1992 | Japan . |

*Primary Examiner*—Donald W. Underwood
*Attorney, Agent, or Firm*—Armstrong, Westerman, Hattori, McLeland & Naughton

[57] ABSTRACT

ICs with leadframes can be efficiently transferred, stocked and positioned without the need for preparing jigs for each kind of IC.

A cassette 4 accommodating a stack of ICs is inserted into a cassette space 35 and held in the center thereof. A moving table 9 is driven to move by a servomotor 21. A lifting member 67 of an IC lifting mechanism 60 raises the ICs in the cassette 4 from the bottom by an amount corresponding to the thickness of one IC at a time. A pulling-over device 70, which is disposed above the cassette space 35, centers the IC in both the lateral and longitudinal directions to thereby effect positioning.

11 Claims, 7 Drawing Sheets

IC STOCKER, IC UNLOADING AND POSITIONING APPARATUS, AND IC FEED SYSTEM

TECHNICAL FIELD

The present invention relates to an IC stocker, an IC unloading and positioning apparatus, and an IC feed system. (The Abbreviation IC, used herein, is a well known indication for an integrated circuit.) More particularly, the present invention relates to an IC stocker for a series of ICs connected with a leadframe, and to an IC unloading and positioning apparatus capable of unloading ICs from the stocker and of positioning them in the center of a transfer path or in the center of a processing position to make preparations for a subsequent step of the process regardless of the configuration and size of ICs. The present invention also relates to an IC feed system incorporating the IC stocker and the IC unloading and positioning apparatus.

BACKGROUND ART

After IC chips have been completed through various manufacturing processes, they are further subjected to processing steps. When leadframes are used, the processing steps are roughly as follows: bonding of a chip to a leadframe, i.e., chip bonding, wiring between the chip and the leadframe, i.e., wire bonding, coating of the chip with a plastic or other similar material for protection, i.e., plastic molding, marking of the casing, and press working, e.g., bending and cutting of the leadframe.

These processing steps are carried out in such a manner that the chips are sequentially transferred to the successive processing steps, and after each chip has been positioned in a processing apparatus provided for each step, necessary processing is performed on the chip. In the meantime, leadframes and packages vary in size and configuration according to specifications. It is necessary in order to continuously carry out the above-described processing steps to set each IC under processing in a desired position during transfer or in a processing apparatus. For this reason, it is possible to use only processing apparatuses which are conformable to the size specifications of leadframes and packages.

To use processing apparatuses in common with respect to various specifications, it is common practice to use a cassette for storing a stack of ICs, a stocker for storing cassettes, a transfer jig, an assembling jig, etc. However, IC leadframes or packages vary in specifications of configuration, size, etc. according to the kind of IC. Accordingly, it is necessary to prepare a number of different kinds of cassette, transfer jig, assembling jig, etc. which corresponds to the number of different kinds of IC to be processed. In addition, if there is a change in lot during manufacture, setup time is needed for changing each of the above-described jigs for each lot.

DISCLOSURE OF THE INVENTION

The present invention has been made with the technical background detailed above, and it aims at attaining the following objects.

It is an object of the present invention to provide an IC stocker, an IC unloading and positioning apparatus, and an IC feed system, which are designed so that setup time for positioning is minimized in the process of manufacturing ICs with leadframes.

It is another object of the present invention to provide an IC stocker, an IC unloading and positioning apparatus, and an IC feed system, which can readily be applied to an existing processing apparatus without modification to feed and transfer ICs.

According to the present invention, a large number of ICs which vary in size and configuration can be efficiently positioned and centered when they are stocked and transferred. Therefore, it is unnecessary to prepare a transfer jig, an assembling jig, etc. for each IC lot.

To solve the above-described problems, the present invention adopts the following means.

The IC stocker comprises:

a moving table for moving on a frame;

means for driving the moving table to move to a desired position on the frame, thereby positioning the moving table;

a cassette for stocking a stack of a plurality of ICs, the cassette being loaded on the moving table;

a plurality of first and second vertical plates for holding the cassette therebetween;

first connecting means for connecting together the first vertical plates;

second connecting means for connecting together the second vertical plates; and means for driving the first and second connecting means to move relative to each other.

The means for driving the first and second connecting means to move relative to each other preferably employs a rack and a pinion.

The IC unloading and positioning apparatus comprises:

a frame;

at least two parallel screw rods disposed on the frame;

a pair of right- and left-hand threads formed on each of the screw rods;

at least four nuts engaged with the threads, respectively;

parallel pulling-over plates each connecting at least two of the nuts;

pulleys secured to the screw rods, respectively, so as to drive the screw rods to rotate in interlocking relation to each other;

a belt for connecting the pulleys; and means provided on one of the screw rods for driving the screw rods to rotate.

The IC feed system comprises:

an IC stocker including a moving table for moving on a first frame, means for driving the moving table to move to a desired position on the frame, thereby positioning the moving table, a cassette for stocking a stack of a plurality of ICs, the cassette being loaded on the moving table, a plurality of first and second vertical plates for holding the cassette therebetween, first connecting means for connecting together the first vertical plates, second connecting means for connecting together the second vertical plates, and means for driving the first and second connecting means to move relative to each other; and an IC unloading and positioning apparatus including a second frame disposed on the first frame, at least two parallel screw rods disposed on the second frame, a pair of right- and left-hand threads formed on each of the screw rods, at least four nuts engaged with the threads, respectively, parallel pulling-over plates each connecting at least two of the nuts, pulleys secured to the screw rods, respectively, so as to drive the screw rods to rotate in interlocking relation to each other, a belt for connecting the pulleys, and means provided on one of the screw rods for driving the screw rods to rotate.

BEST MODE FOR CARRYING OUT THE INVENTION

Figure 1:
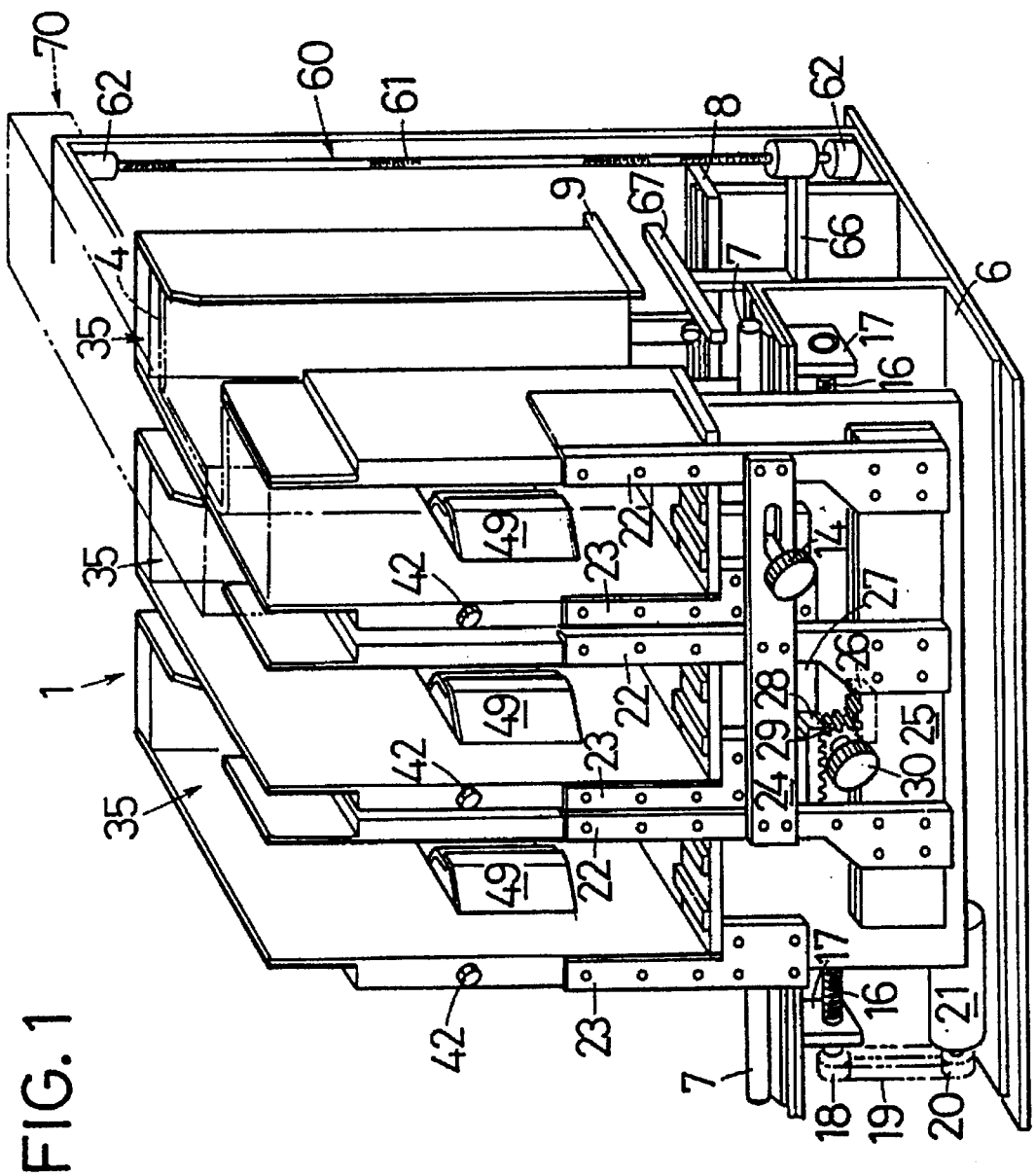
FIG. 1 is a cabinet projection of a stocker as viewed from the front side thereof.
Figure 2:
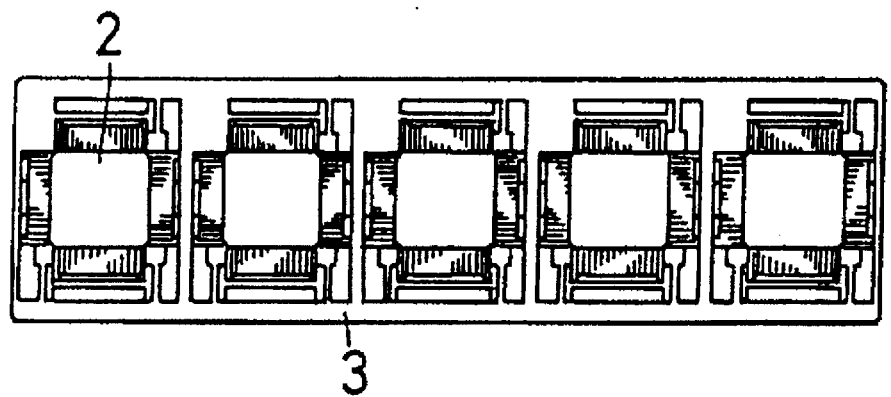
FIG. 2 is a plan view showing an example of an IC with a leadframe.
Figure 3:
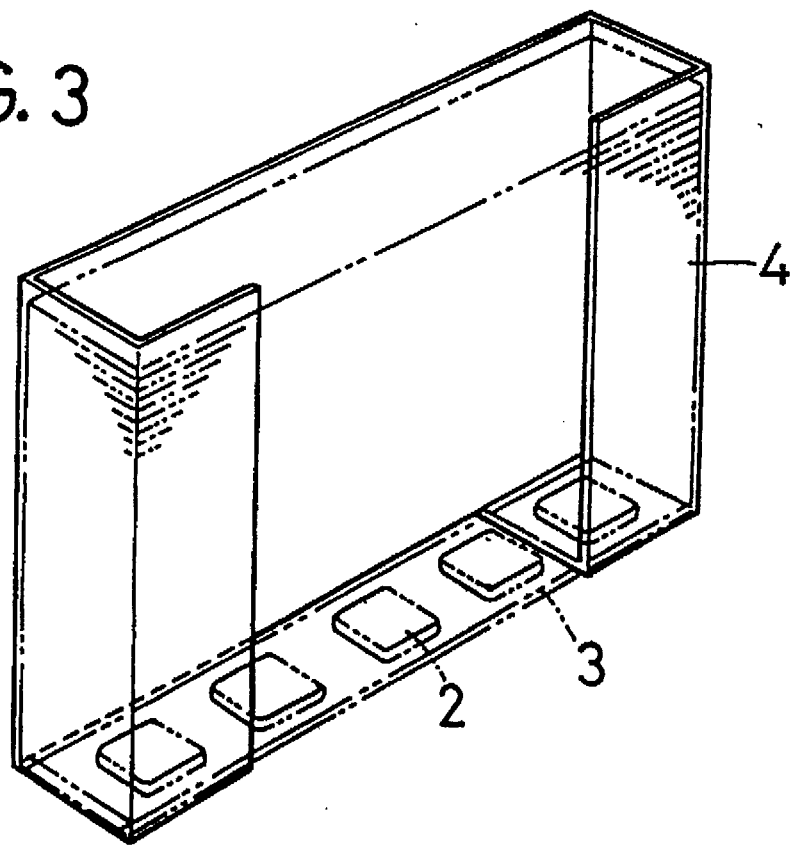
FIG. 3 is an oblique projection showing the external appearance of a cassette.

FIG. 1 is a cabinet projection roughly showing a stocker 1 for ICs with leadframes. In an example as shown in FIG. 2, ICs 2 are fed from the preceding step in a state where a series of five ICs are connected to a leadframe 3. A large number of ICs 2 are stacked in a cassette 4, and the cassette 4 is manually or automatically loaded into a stocker 1 (see FIG. 3). The cassette 4 is open at the side, bottom and top thereof. Therefore, the ICs 2 can be pushed up from the bottom of the cassette 4 by a lifting member 67 (see FIGS. 1 and 4) and taken out one by one from the top of the cassette 4, as described later.

Since the ICs 2 vary in configuration and size according to the kind of IC, cassettes 4 which have different sizes are prepared in advance. The cassette 4 is fixedly held in the stocker 1. The ICs 2 can be taken out one by one from the top of the cassette 4 by a mechanism (described later).

Figure 4:
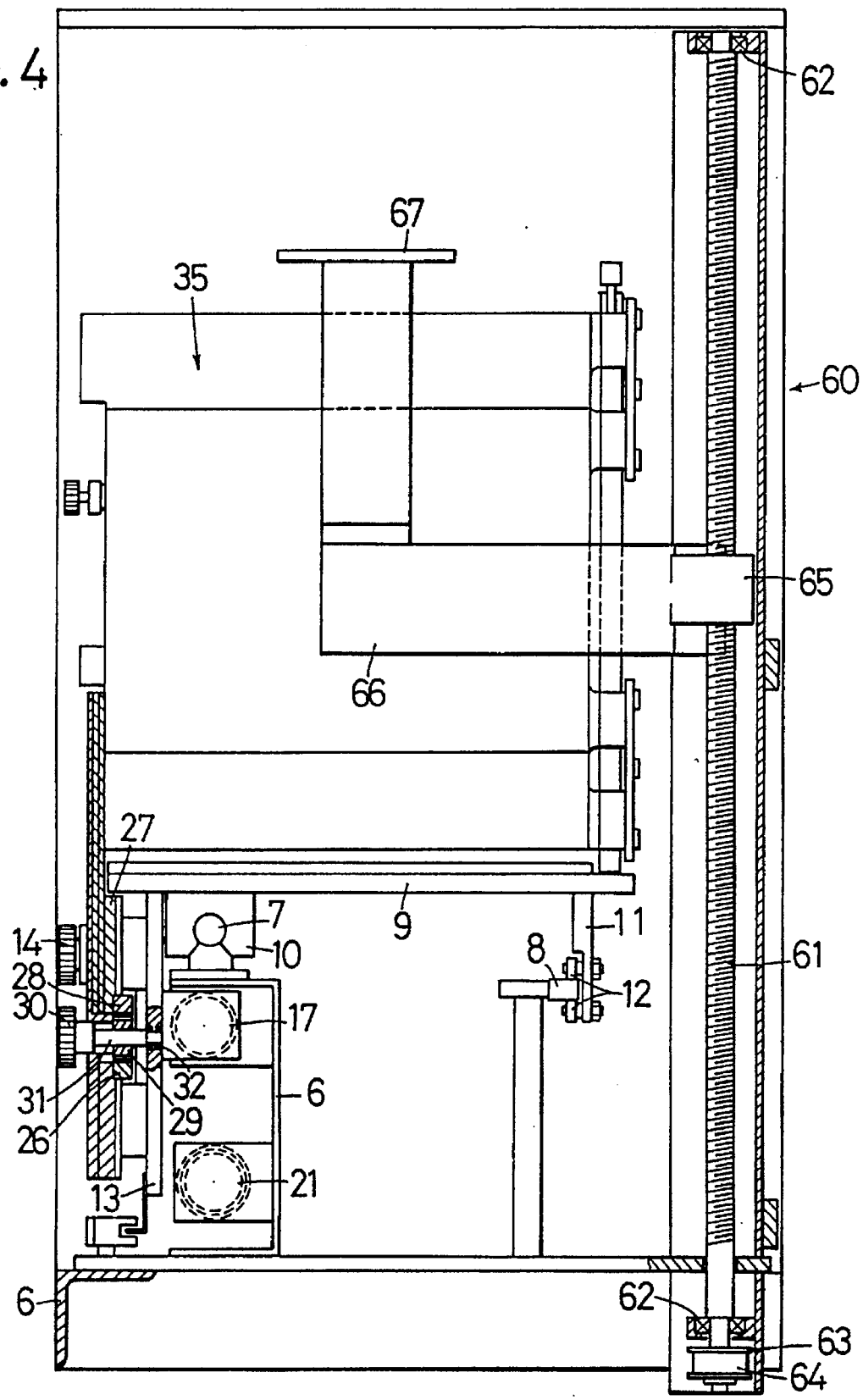
FIG. 4 is a partly-sectioned side view of the stocker as viewed from the right-hand side thereof.

The stocker 1 will be explained below. FIG. 4 is a side view of the stocker as viewed from the right-hand side thereof with the front side thereof partly sectioned. On a frame 6 constituting the stocker 1, a planar guide 8 having guide surfaces at the upper and lower sides thereof is disposed in parallel to a guide rod 7 which is formed from a straight steel bar. A moving table 9 is disposed above the guide rod 7 and the planar guide 8. A rolling bearing 10 is provided on the lower side of the forward end of the moving table 9. The rolling bearing 10 moves on the guide rod 7.

Further, the upper end of a vertical support member 11, which is formed from a plate material, is secured to the lower side of the rear end of the moving table 9 by welding or other similar method.

Two rollers 12 are disposed on the lower end of the support member 11. The rollers 12 move while holding therebetween the two, upper and lower, parallel guide surfaces of the planar guide 8. In other words, the moving table 9 is movable on the guide rod 7 and the planar guide 8. A front wall 13, which is a vertical wall member, is provided on the lower side of the forward end of the moving table 9 as an integral part of the moving table 9.

A ball nut (not shown) is secured to the lower side of the moving table 9. The ball nut is engaged with a feed screw 16, which is a ball screw (see FIG. 1). The feed screw 16 is rotatably supported at both ends thereof by the frame 6 through two bearings 17. A timing pulley 18 is secured to one end of the feed screw 16. The timing pulley 18 is engaged with a timing belt 19.

Further, the timing belt 19 is in engagement with another timing pulley 20. The timing pulley 20 is connected to and driven by an AC servomotor 21. Thus, the moving table 9 is driven by the AC servomotor 21 in response to a command from a controller (not shown) so as to move on the guide rod 7 and the planar guide 8, thereby being set in a desired position.

On the moving table 9, three first vertical plates 22 and three second vertical plates 23 are disposed so that each first vertical plate 22 faces one second vertical plate 23 with a spacing provided therebetween. Thus, three cassette spaces 35 for holding cassettes 4 are defined between the first and second vertical plates 22 and 23. The three first vertical plates 22 are connected to each other by a first upper connecting plate 24 and a first lower connecting plate 25. Accordingly, the three first vertical plates 22 are moved in interlocking relation to each other.

A first rack 26 is secured to the top of the first lower connecting plate 25. The three second vertical plates 23 are similarly connected to each other by a second connecting plate 27. Accordingly, the three second vertical plates 23 are moved in interlocking relation to each other. A second rack 28 is secured to the bottom of the second connecting plate 27. Both the first and second racks 26 and 28 are in mesh with a pinion 29.

The pinion 29 is provided with a turning knob 30 in coaxial relation to a shaft 31 (see FIG. 4). The distal end of the shaft 31 is rotatably supported by the front wall 13 of the moving table 9 through a bearing 32. Accordingly, when the knob 30 is turned, the pinion 29 is rotated, and the first and second racks 26 and 28 are simultaneously moved in opposite directions to each other by the same distance. In response to the movement of the first and second racks 26 and 28, the three first vertical plates 22 and the three second vertical plates 23 simultaneously move toward or away from each other while maintaining the parallel relationship therebetween.

Cassette spaces 35 are formed between the first and second vertical plates 22 and 23. In the illustrated example, three cassette spaces 35 are disposed (see FIG. 1). In each cassette space 35, a cassette 4 is held between two facing cassette locking grippers 49 and 46 (described later). The cassette 4 is held in the central position in both the longitudinal direction of the cassette space 35, which is the direction of the depth thereof, and the lateral direction of the cassette space 35, which is the direction of the width thereof. Cassettes 4 vary in lateral and longitudinal dimensions according to the configuration of the ICs 2, as has been described above.

The lateral (width) and longitudinal (depth) dimensions of the cassette space 35 are adjustable so that it is compatible with a cassette 4 of any size. Positioning in the lateral direction of the cassette space 35 is effected by the above-described interlocking mechanism, which is formed by using the first rack 26, the second rack 28, and the pinion 29. After the interlocking mechanism has been set, the width of the cassette space 35 is adjusted so as to be the same as the width of the cassette 4 and fixed by using a locking screw 14. The locking screw 14 is used to lock the upper connecting plate 24 and the second connecting plate 27 to each other by fastening them. Positioning in the direction of the depth of the cassette space 35 is effected by using a cassette holder mechanism 40 described below.

[Cassette holder mechanism 40]

Figure 5:
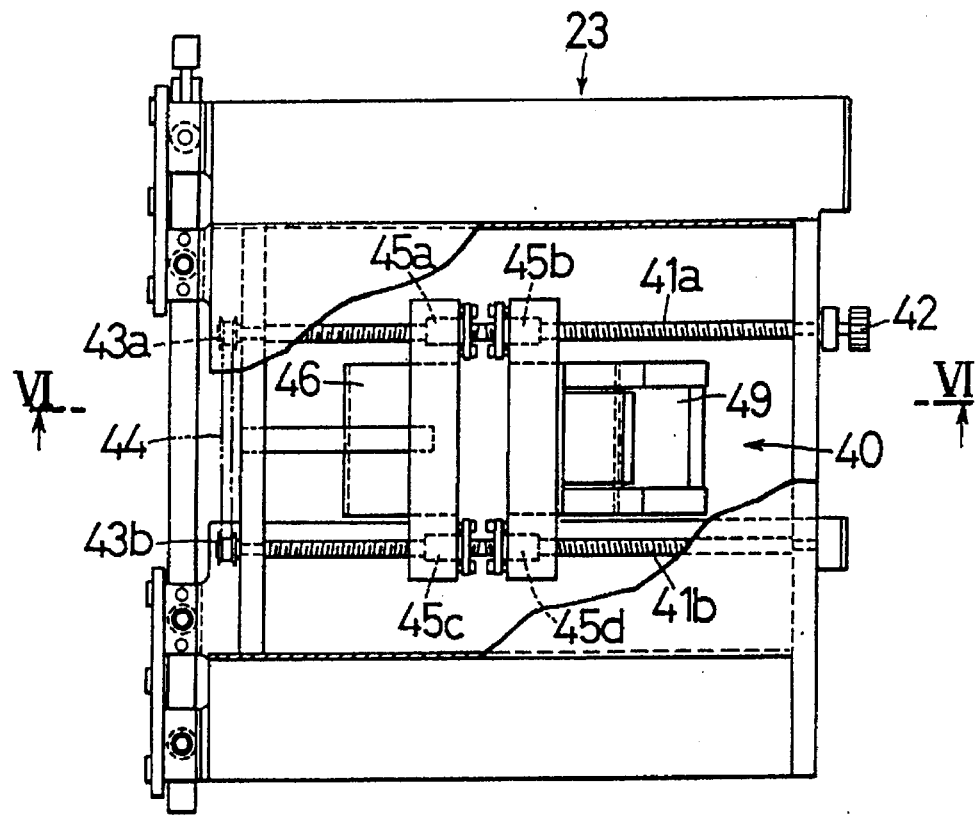
FIG. 5 is a view seen from the lest side of the device shown in FIG. 1, showing a second vertical plate in a partly-cutaway view.
Figure 6:
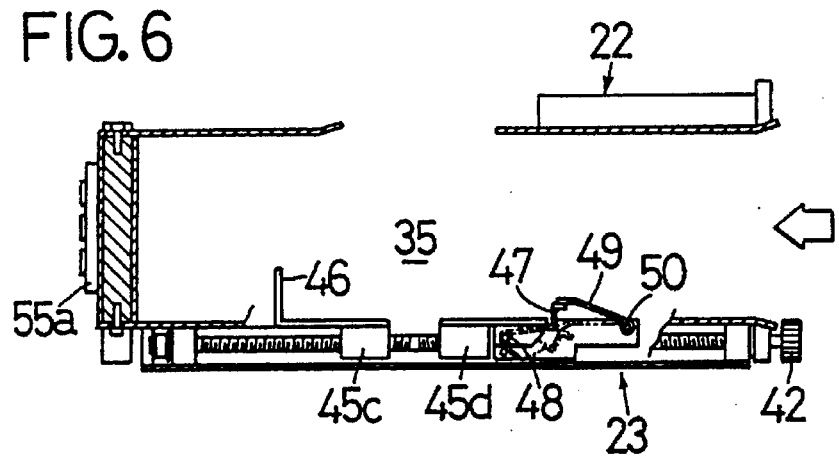
FIG. 6 is a section view taken along the line VI—VI shown in FIG. 5.
Figure 7:
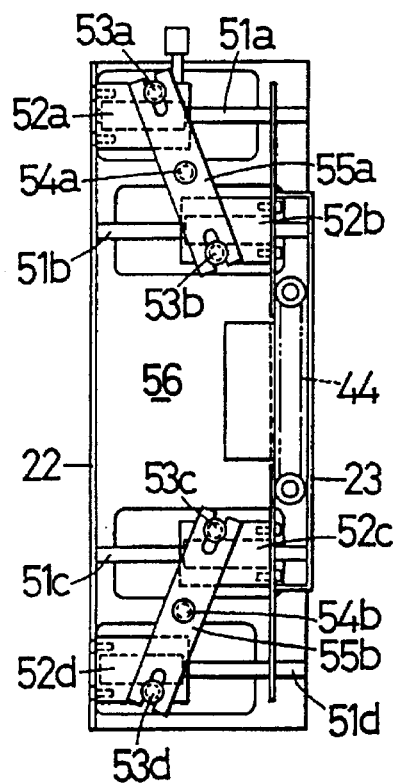
FIG. 7 is a side view of the arrangement shown in FIG. 5 as viewed from the left-hand side thereof.

FIG. 5 is a view seen from the direction V in FIG. 1, showing the second vertical plate 23 in a partly-cutaway view. FIG. 6 is a sectional view taken along the line VI—VI in FIG. 5. FIG. 7 is a side view of the arrangement shown in FIG. 5 as viewed from the left-hand side thereof. In each first vertical plate 22, two parallel screw rods 41a and 41b, which are ball screws, are disposed at upper and lower positions, respectively. The screw rods 41a and 41b each have right- and left-hand threads cut on the respective surfaces of two portions thereof which are on both sides of the longitudinal center. A turning knob 42 is connected to one end of one screw rod 41a so that the screw rod 41a can be rotated by manually turning the knob 42.

Timing pulleys 43a and 43b are respectively secured to the other ends of the screw rods 41a and 41b. A timing belt 44 is stretched between and engaged with the two timing pulleys 43a and 43b. Four nuts 45a, 45b, 45c and 45d are screwed onto the respective right- and left-hand threads of the screw rods 41a and 41b. An L-shaped first gripper 46 is secured to two nuts 45a and 45c. A second gripper 47 is secured to two other nuts 45b and 45d.

The second gripper 47 pivots about a shaft 48 (see FIG. 6). The second gripper 47 is constantly pressed toward the cassette space 35 by a spring. A pressing plate 49 is provided on the top of the second gripper 47 in such a manner that the pressing plate 49 is pivotable about a shaft 50. The pressing plate 49 is biased by a spring so as to press the second gripper 47 toward the second vertical plate 23.

Thus, when the pressing plate 49 is pressed against the spring, it pivots about the shaft 50. The pressing plate 49 pushes the second gripper 47 to pivot about the shaft 48. Accordingly, a cassette 4 can be inserted (in the direction of the arrow) by pushing the pressing plate 49. The cassette 4 is held between the first and second grippers 46 and 47. Therefore, once it is inserted, the cassette 4 cannot be taken out. This function is used when the cassette 4 is inserted into the cassette space 35 from the front side thereof. In this way, the cassette 4 is positioned in the center in the longitudinal (depth) direction of the cassette space 35.

FIG. 7 is a side view of the arrangement shown in FIG. 5 as viewed from the left-hand side thereof. A third vertical plate 56 is disposed on the moving table 9 at the rear between the first and second vertical plates 22 and 23. The third vertical plate 56 has four parallel guide rods 51a, 51b, 51c and 51d disposed thereon horizontally. Moving members 52a, 52b, 52c and 52d are movably fitted on the guide rods 51a, 51b, 51c and 51d, respectively, through bearings.

One end of each of the moving members 52a and 52d is secured to the first vertical plate 22 by using screws. The first vertical plate 22 and the moving members 52a and 52d move as one unit. One end of each of the moving members 52b and 52c is secured to the second vertical plate 23 by using screws. The first vertical plate 22 and the moving members 52b and 52c move as one unit.

In the meantime, the third vertical plate 56 has shafts 54a and 54b. Two interlocking links 55a and 55b are rotatably attached to the shafts 54a and 54b, respectively. U-shaped grooves are formed at both ends of each of the interlocking links 55a and 55b, and pins 53a, 53b, 53c and 53d are inserted into the U-shaped grooves, respectively. Thus, the first and second vertical plates 22 and 23 move toward or away from each other while maintaining the parallel relationship therebetween in response to the movement of the interlocking links 55a and 55b.

[IC lifting mechanism 60]

An IC lifting mechanism 60 is shown in FIGS. 1 and 4. The ICs 2 which are stacked in the cassette 4 are taken out one by one from the top of the cassette 4 by a loader and transferred to the subsequent step. At this time, it is necessary to push up the ICs 2 from the bottom of the cassette 4. The IC lifting mechanism 60 is a mechanism for lifting the stacked ICs 2 from the bottom of the cassette 4. A vertically extending ball screw 61 is rotatably supported through bearings 62 by the frame 6 in a corner of the stocker 1. A timing pulley 63 is secured to the lower end of the ball screw 61. The timing pulley 63 is engaged with a timing belt 64. The timing belt 64 is driven to rotate by a servomotor (not shown). The ball screw 61 is engaged with a ball nut 65.

An arm 66 is integrally secured to the ball nut 65. A lifting member 67 is integrally provided on the distal end of the arm 66. The lifting member 67 raises the ICs 2 by an amount corresponding to the thickness of one IC 2 at a time from the bottom of the cassette 4 held in the cassette space 35.

[Pulling-over device 70]

A pulling-over device 70 is disposed above the cassette space 35 disposed at the right-hand end (see FIG. 1). The pulling-over device 70 is a centering mechanism for positioning and centering ICs 2 pushed up from the top of the cassette 4, thereby making the ICs 2 ready for the transfer to the subsequent step.

Figure 8:
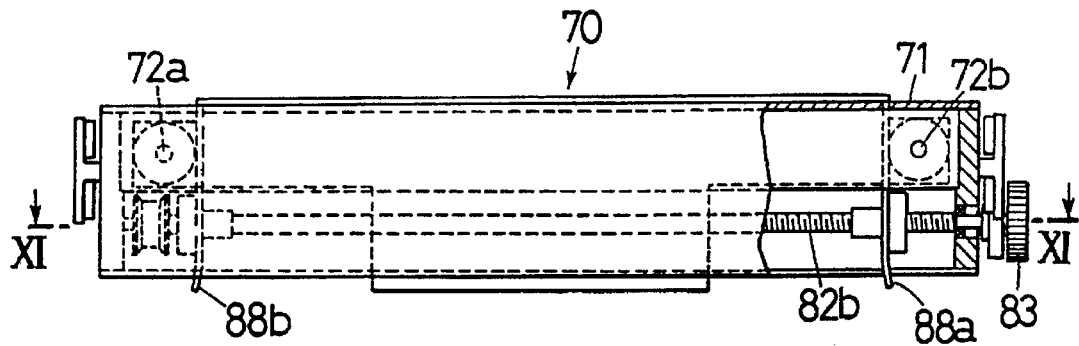
FIG. 8 is a front view of a pulling-over device with the top thereof partly cutaway.
Figure 9:
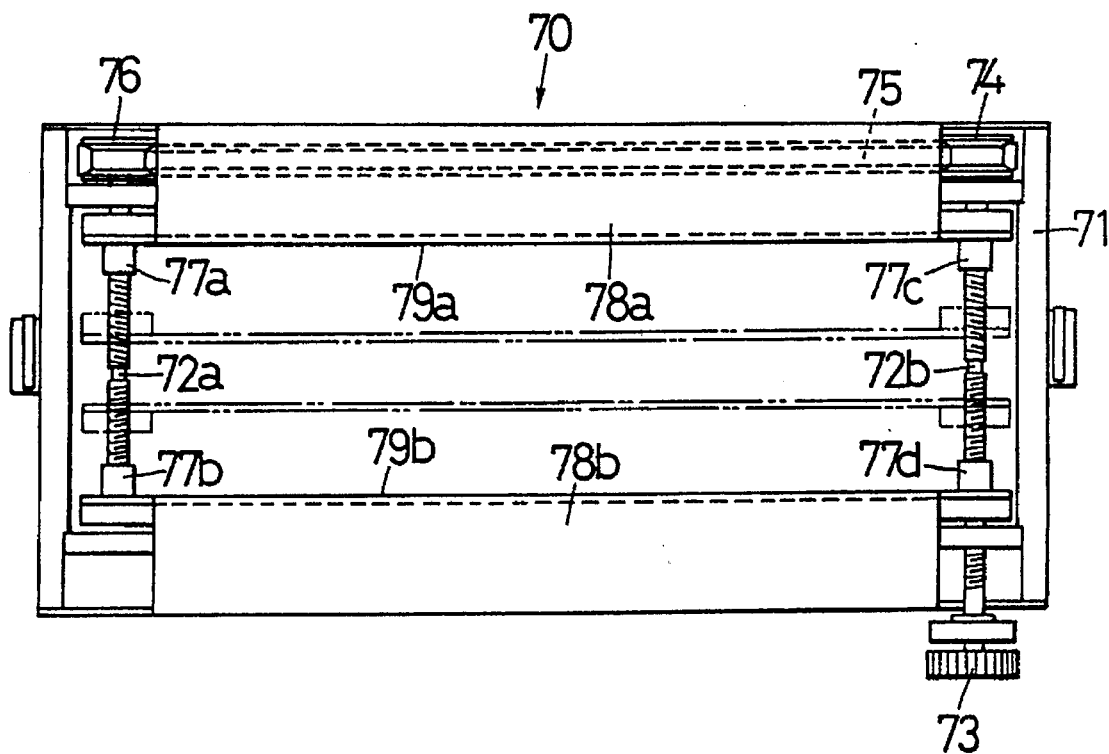
FIG. 9 is a plan view of the pulling-over device shown in FIG. 8.
Figure 10:
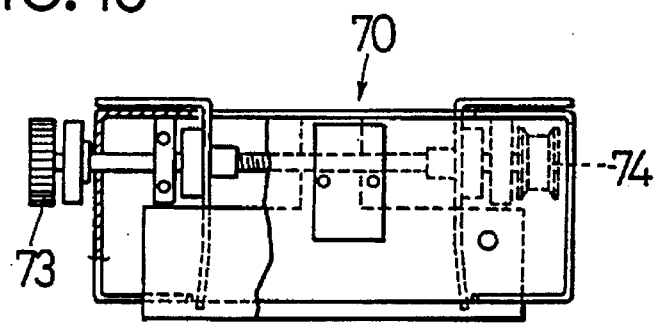
FIG. 10 is a side view of the pulling-over device shown in FIG. 8 as viewed from the right-hand side thereof.
Figure 11:
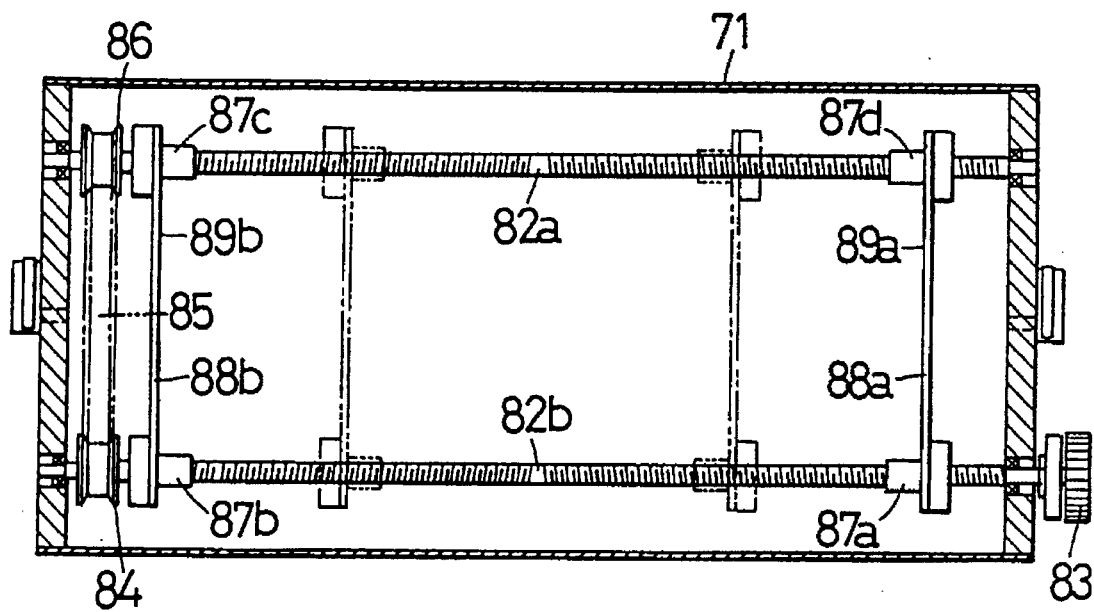
FIG. 11 is a sectional view taken along the line XI—XI in FIG. 8.

FIG. 8 is a partly-cutaway front view of the pulling-over device 70. FIG. 9 is a plan view of the pulling-over device 70 shown in FIG. 8. FIG. 10 is a side view of the pulling-over device 70 shown in FIG. 8 as viewed from the right-hand side thereof. FIG. 11 is a sectional view taken along the line XI—XI in FIG. 8. A frame 71 has a rectangular configuration. Two parallel screw rods 72a and 72b are rotatably supported in the upper part of the frame 71 (see FIG. 9).

The screw rods 72a and 72b each have right- and left-hand threads cut on the respective surfaces of two portions thereof which are on both sides of the longitudinal center. A turning knob 73 is connected to one end of one screw rod 72b. A timing pulley 74 is secured to the other end of the screw rod 72b. The timing pulley 74 is engaged with a timing belt 75.

The timing belt 75 is in engagement with another timing pulley 76. The timing pulley 76 is secured to one end of the screw rod 72a. Accordingly, the screw rods 72a and 72b are rotated in the same direction in interlocking relation to each other. Nuts 77a, 77b, 77c and 77d are screwed onto the respective right- and left-hand threads of the screw rods 72a and 72b. A pulling-over plate 78a, which is an L-shaped plate material, is integrally connected to the nuts 77a and 77c. Similarly, an L-shaped pulling-over plate 78b is connected to the nuts 77b and 77d. The respective sides 79a and 79b of the pulling-over plates 78a and 78b come in contact with both sides of the IC leadframe 3 to effect positioning.

Thus, when the knob 73 is turned, the screw rod 72b is rotated, and the rotation of the screw rod 72b drives the screw rod 72a to rotate through the timing pulley 74, the timing belt 75 and the timing pulley 76. The rotation of the two screw rods 72a and 72b causes the nuts 77a, 77b, 77c and 77d to move, which, in turn, causes the pulling-over plates 78a and 78b to move toward or away from each other on both sides of the center line of the pulling-over device 70. Accordingly, the ICs 2 are always positioned in the center of the pulling-over device 70.

The above-described mechanism is a pulling-over mechanism for centering a series of connected ICs 2 in the lateral direction. A mechanism based on the same principle as the above is disposed below the pulling-over device 70 for positioning and centering ICs 2 in the longitudinal (depth) direction. FIG. 11 is a sectional plan view taken along the line XI—XI in FIG. 8. Two parallel screw rods 82a and 82b are rotatably supported in the lower part of the frame 71.

The screw rods 82a and 82b each have right- and left-hand threads cut on the respective surfaces of two portions thereof which are on both sides of the longitudinal center. A turning knob 83 is secured to one end of one screw rod 82b. A timing pulley 84 is secured to the other end of the screw rod 82b. The timing pulley 84 is engaged with a timing belt 85.

The timing belt 85 is in engagement with another timing pulley 86. The timing pulley 86 is secured to one end of the screw rod 82a. Accordingly, the screw rods 82a and 82b are rotated in the same direction in interlocking relation to each other. Nuts 87a, 87b, 87c and 87d are screwed onto the respective right- and left-hand threads of the screw rods 82a and 82b. An L-shaped pulling-over plate 88a is connected to the nuts 87a and 87d. Similarly, an L-shaped pulling-over plate 88b is connected to the nuts 87b and 87c. The respective sides 89a and 89b of the pulling-over plates 88a and 88b come in contact with both sides of the IC leadframe 3 to effect positioning.

Thus, when the knob 83 is turned, the screw rod 82b is rotated, and the rotation of the screw rod 82b eventually causes the pulling-over plates 88a and 88b to move toward or away from each other on both sides of the center line. Accordingly, the ICs 2 are always positioned and centered in the longitudinal (depth) direction. As has been detailed above, even a rectangular leadframe 3 whose lateral and longitudinal lengths are different can be set in the central position simply by turning the knobs 73 and 83. In addition, since the central position of the workpiece is always invariable, that is, since the workpiece is positioned in the center in both the lateral and longitudinal directions, the setup required at the subsequent step, to which the ICs are transferred, is even more facilitated.

[Operation]

ICs which have been processed at the preceding step are accommodated in a cassette 4 of the same size as that of the ICs 2 and transferred in this state. The cassette 4 is inserted into a cassette space 35 in the stocker 1 from the front side thereof. The width and length of the cassette space 35 are adjustable so that it is compatible with a cassette 4 of any size. Positioning in the lateral (width) direction of the cassette space 35 is effected by the above-described interlocking mechanism, which is formed by using the first rack 26, the second rack 28 and the pinion 29.

After the interlocking mechanism has been set, the width of the cassette space 35 is fixed by using the locking screw 14. The locking screw 14 is used to lock the upper connecting plate 24 and the second connecting plate 27 to each other by fastening them. Positioning in the direction of the depth of the cassette space 35 is effected by using the cassette holder mechanism 40. The cassette 4 is inserted into the cassette space 35 from the front side thereof while pushing the pressing plate 49. The cassette 4 is held between the first and second cassette locking grippers 36 and 47 provided on the first vertical plate 22.

Next, when the AC servomotor 21 is rotated, the timing pulley 20, the timing belt 19 and the timing pulley 18 are driven to rotate the feed screw 16. The rotation of the feed screw 16 causes the moving table 9 to move on the guide rod 7 and the planar guide 8. A selected cassette space 35 on the moving table 9 stops at a position above the lifting member 67 of the IC lifting mechanism 60.

Thereafter, the ball screw 61 is rotated by the servomotor (not shown), causing the lifting member 67 to be raised by an amount corresponding to the thickness of one IC 2. The upward movement of the lifting member 67 causes only one IC 2 disposed in the top of the cassette space 35 to enter the pulling-over device 70. At this time, the IC 2 is centered in the lateral direction by the pulling-over plates 78a and 78b and, at the same time, centered in the longitudinal direction by the pulling-over plates 88a and 88b. After being positioned in this way, the IC 2 is transferred from the upper side of the pulling-over device 70 to the subsequent step by the loader (not shown).

When one cassette space 35 has been emptied of the ICs 2, the lifting member 67 returns to the previous position. Then, the AC servomotor 21 is rotated again to move the moving table 9 so as to position the next cassette space 35 under the pulling-over device 70. In this way, the above-described operation is repeated.

What is claimed is:

1. An IC stocker, comprising:

a frame;

a moving table (9) for moving on said frame (6);

means (16–21) for driving said moving table (9) to move to a desired position on said frame (6), thereby positioning said moving table (9);

a plurality of alternating first and second vertical plates which hold a respective cassette, for stocking a stack of a plurality of ICs, between adjacent ones of first and second vertical plates, said vertical plates being mounted on said moving table;

first connecting means (24, 25) for connecting together said first vertical plates (22);

second connecting means (27) for connecting together said second vertical plates (23);

means (26, 27, 29 . . . ) for driving said first and second vertical plates (22, 23) to move relative to each other; and an IC lifting mechanism (60) disposed at one end of said frame for pushing against the ICs and lifting said ICs (2) stacked in said cassette (4) up relative to the bottom of said cassette (4) when said cassette (4) is positioned at said end by said moving table.

2. An IC stocker, comprising:

a frame;

a moving table (9) for moving on said frame (6);

means (16–21) for driving said moving table (9) to move to a desired position on said frame (6), thereby positioning said moving table (9);

a plurality of alternating first and second vertical plates (22, 23) which hold a respective cassette, for stocking a stack of a plurality of ICs, between adjacent ones of said first and second vertical plates, said vertical plates being mounted on said moving table;

first connecting means (24, 25) for connecting together said first vertical plates (22);

second connecting means (27) for connecting together said second vertical plates (23);

means (26, 27, 29 . . . ) for driving said first and second vertical plates (22, 23) to move relative to each other; and a cassette holder mechanism (40) between each pair of said first and second vertical plates for positioning said cassette (4) in the center in the direction of the depth of a cassette space (35) defined between said respective pair of said first and second vertical plates (22, 23), said cassette holder mechanism including a first rear end gripper (46) for holding a rear end of the cassette and a movable front end gripper (47) which is movable during insertion of the cassette into the cassette space and movable to hold a front end of the cassette when inserted, said cassette holder mechanism including a moving mechanism which moves said rear end gripper and said front end gripper toward and away from one another.

3. An IC stocker, comprising:

a frame;

a moving table (9) for moving on said frame (6);

means (16–21) for driving said moving table (9) to move to a desired position on said frame (6), thereby positioning said moving table (9);

a plurality of alternating first and second vertical plates which hold a respective cassette, for stocking a stack of a plurality of ICs, between adjacent ones of first and second vertical plates, said vertical plates being mounted on said moving table;

first connecting means (24, 25) for connecting together said first vertical plates (22);

second connecting means (27) for connecting together said second vertical plates (23);

means (26, 27, 29 . . . ) for driving said first and second vertical plates (22, 23) to move relative to each other;

an IC lifting mechanism (60) disposed at one end of said frame for lifting said ICs (2) stacked in said cassette (4) from the bottom of said cassette (4) when said cassette (4) is positioned at said end by said moving table; and wherein said IC lifting mechanism (60) comprises:

a ball screw (61) disposed to extend in a direction parallel to a direction in which said ICs (2) are lifted;

a ball nut (65) screwed onto said ball screw (61) and integral with a lifting member (66, 67) which comes in contact with the lowermost IC (2) and lifts it; and means (63, 64) for driving said ball screw (61) to rotate.

4. An IC stocker, comprising:

a frame;

a moving table (9) for moving on said frame (6);

means (16–21) for driving said moving table (9) to move to a desired position on said frame (6), thereby positioning said moving table (9);

a plurality of alternating first and second vertical plates (22, 23) which hold a respective cassette for stocking a stack of a plurality of ICs, between adjacent ones of said first and second vertical plates, said vertical plates being mounted on said moving table;

first connecting means (24, 25) for connecting together said first vertical plates (22);

second connecting means (27) for connecting together said second vertical plates (23);

means (26, 27, 29 . . . ) for driving said first and second vertical plates (22, 23) to move relative to each other; and a cassette holder mechanism (40) between each pair of said first and second vertical plates for positioning said cassette (4) in the center in the direction of the depth of a cassette space (35) defined between said respective pair of said first and second vertical plates (22, 23); and wherein said cassette holder mechanism (40) comprises:

at least two parallel screw rods (41a, 41b) disposed on said first vertical plate (22);

a pair of external right- and left-hand threads formed on each of said screw rods (41a, 41b);

at least four nuts (45a–45d) screwed onto said external threads, respectively;

a pair of first and second grippers (46 and 47) extending parallel to each other between said screw rods (41a, 41b) and each connecting at least two of said nuts (45a–45d) for gripping said cassette (4) from both sides thereof;

pulleys (43a, 43b) secured to said screw rods (41a, 41b), respectively, so as to drive said screw rods (41a, 41b) to rotate in interlocking relation to each other;

a belt (44) for connecting said pulleys (43a, 43b); and means (42) provided on one of said screw rods (41a, 41b) for driving said screw rods (41a, 41b) to rotate.

5. An IC stocker according to claim 1 or 2, wherein said relative movement driving means (26, 27, 29 . . . ) comprises racks (26, 28) and a pinion (29).

6. An IC feed system, comprising:

a frame;

a moving table (9) for moving on said frame (6);

means (16–21) for driving said moving table (9) to move to a desired position on said frame (6), thereby positioning said moving table (9);

a plurality of alternating first and second vertical plates (22, 23) which hold a respective cassette, for stocking a stack of a plurality of ICs, between adjacent ones of said first and second vertical plates, said vertical plates being mounted on said moving table;

first connecting means (24, 25) for connecting together said first vertical plates (22);

second connecting means (27) for connecting together said second vertical plates (23);

means (26, 27, 29 . . . ) for driving said first and second vertical plates (22, 23) to move relative to each other;

an IC lifting mechanism (60) disposed at one end of said frame for pushing against the ICs and lifting said ICs (2) stacked in said cassette (4) up relative to the bottom of said cassette (4) when said cassette (4) is positioned at said end by said moving table; and a pulling-over device (70) disposed above said end of said frame for receiving each IC (2) as it is pushed from said cassette (4) by said lifting mechanism (60) and for positioning and centering said IC (2) lifted from said cassette (4) for transfer to a subsequent processing step.

7. An IC feed system, comprising:

a frame;

a moving table (9) for moving on said frame (6);

means (16–21) for driving said moving table (9) to move to a desired position on said frame (6), thereby positioning said moving table (9);

a plurality of alternating first and second vertical plates (22, 23) which hold a respective cassette, for stocking a stack of a plurality of ICs, between adjacent ones of said first and second vertical plates, said vertical plates being mounted on said moving table;

first connecting means (24, 25) for connecting together said first vertical plates (22);

second connecting means (27) for connecting together said second vertical plates (23);

means (26, 27, 29 . . . ) for driving said first and second vertical plates (22, 23) to move relative to each other;

a cassette holder mechanism (40) between each pair of said first and second vertical plates (22, 23) for positioning said cassette (4) in the center in the direction of the depth of a cassette space (35) defined between said respective pair of said first and second vertical plates (22, 23);

an IC lifting mechanism (60) disposed at one end of said frame for pushing against the ICs and lifting said ICs (2) stacked in said cassette (4) up relative to the bottom of said cassette (4); and a pulling-over device (70) disposed above said end of said frame for receiving each IC (2) as it is pushed from said cassette (4) by said lifting mechanism 60 and for positioning and centering said IC (2) lifted from said cassette (4) for transfer to a subsequent processing step.

8. An IC feed system according to claim 6 or 7, wherein said pulling-over device (70) comprises:

a second frame (71);

at least two parallel first screw rods (82a, 82b) disposed on said second frame (71);

a pair of external right- and left-hand threads formed on each of said first screw rods (82a, 82b);

at least four first nuts (87a–87d) screwed onto said external threads, respectively;

first parallel pulling-over plates (88a, 88b) each connecting at least two of said first nuts (87a–87d);

first pulleys (84, 86) secured to said first screw rods (82a, 82b), respectively, so as to drive said screw rods (82a, 82b) to rotate in interlocking relation to each other;

a first belt (85) for connecting said first pulleys (84, 86); and first driving means (83) provided on one of said first screw rods (82a, 82b) for driving said first screw rods (82a, 82b) to rotate.

9. An IC feed system according to claim 8, comprising:

at least two parallel second screw rods (72a, 72b) disposed on said second frame (71) at right angles to said first screw rods (82a, 82b);

a pair of external right- and left-hand threads formed on each of said second screw rods (72a, 72b);

at least four second nuts (77a–77d) screwed onto said external threads, respectively;

second parallel pulling-over plates (78a, 78b) each connecting at least two of said second nuts (77a–77d);

second pulleys (74, 76) secured to said second screw rods (72a, 72b), respectively, so as to drive said second screw rods (72a, 72b) to rotate in interlocking relation to each other;

a second belt (75) for connecting said second pulleys (74, 76); and second driving means (73) provided on one of said second screw rods (72a, 72b) for driving said second screw rods (72a, 72b) to rotate.

10. An IC feed system according to claim 6 or 7, wherein said relative movement driving means (26, 27, 29 . . . ) comprises racks (26, 28) and a pinion (29).

11. An IC feed system according to claim 7, wherein said cassette holder mechanism (40) comprises:

at least two parallel screw rods (41a, 41b) disposed on said first vertical plate (22);

a pair of external right- and left-hand threads formed on each of said screw rods (41a, 41b);

at least four nuts (45a–45d) screwed onto said external threads, respectively;

a pair of first and second grippers (46 and 47) extending parallel to each other between said screw rods (41a, 41b) and each connecting at least two of said nuts (45a–45d) for gripping said cassette (4) from both sides thereof;

pulleys (43a, 43b) secured to said screw rods (41a, 41b), respectively, so as to drive said screw rods (41a, 41b) to rotate in interlocking relation to each other;

a belt (44) for connecting said pulleys (43a, 43b); and means (42) providing on one of said screw rods (41a, 41b) for driving said screw rods (41a, 41b) to rotate.

* * * * *